United States Patent
Byeon et al.

(10) Patent No.: US 6,882,570 B2
(45) Date of Patent: Apr. 19, 2005

(54) POWER DETECTING CIRCUIT AND METHOD FOR STABLE POWER-ON READING OF FLASH MEMORY DEVICE USING THE SAME

(75) Inventors: Dae-Seok Byeon, Seoul (KR); Kyeong-Han Lee, Gyeonggi-do (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 0 days.

(21) Appl. No.: 10/402,758

(22) Filed: Mar. 27, 2003

(65) Prior Publication Data

US 2003/0223271 A1 Dec. 4, 2003

(30) Foreign Application Priority Data

May 28, 2002 (KR) ................................ 10-2002-0029493

(51) Int. Cl.[7] .............................................. G11C 16/04
(52) U.S. Cl. ........................... 365/185.18; 365/189.07; 365/226
(58) Field of Search ....................... 365/185.18, 189.07, 365/226, 185.33

(56) References Cited

U.S. PATENT DOCUMENTS 6,101,127 A * 8/2000 Rolandi ..................... 365/226
6,108,246 A * 8/2000 Umezawa et al. ...... 365/185.18
6,204,703 B1 * 3/2001 Kwon ......................... 327/143

FOREIGN PATENT DOCUMENTS

KR          2000-35580          6/2000

OTHER PUBLICATIONS

English language of Abstract for Korean Patent Publication No. 2000-35580.

* cited by examiner

Primary Examiner—Huan Hoang
(74) Attorney, Agent, or Firm—Marger Johnson & McCollom, P.C.

(57) ABSTRACT

Embodiments of the invention provide a power-on reset function that establishes logic circuits in a memory chip at an initial stable state and a power-on read function that triggers a read operation of the memory chip. A first voltage detector output signal transitions when a power supply voltage reaches a first voltage, setting the logic circuits at the initial stable state. A second voltage detector output signal transitions when the power supply voltage reaches a second voltage, placing a latch in a set state that results in activation of a power-on read signal. A power-on read operation is carried out according to the activation of the power-on read signal. If the power supply voltage is not lowered below the first voltage, the second voltage detector output signal does not transition. Accordingly, embodiments are capable of preventing power-on read operations that are unnecessarily performed owing to power noise.

40 Claims, 4 Drawing Sheets

US 6,882,570 B2

POWER DETECTING CIRCUIT AND METHOD FOR STABLE POWER-ON READING OF FLASH MEMORY DEVICE USING THE SAME

CROSS REFERENCE TO RELATED APPLICATIONS

This application claims priority from Korean Patent Application No. 2002-29493, filed on May 28, 2002, the contents of which are herein incorporated by reference in their entirety for all purposes.

BACKGROUND OF THE INVENTION

1. Technical Field of the Invention

This disclosure relates to a power detecting circuit of a semiconductor memory device, and in particular to a power detecting circuit having a power-on reset function and a power-on read function of a semiconductor memory device. Further disclosed is a method for generating a power-on reset signal and a power-on read signal.

2. Description of the Related Art

A semiconductor memory device includes an array of memory cells and a number of logic circuits for controlling the array. For example, the logic circuits may be formed of a number of latches and flip-flops. Logic circuits, and in particular, flip-flops and latches, must initially have states that are well-defined. This is accomplished by a power detecting circuit. A conventional power detecting circuit outputs a power-on reset signal that is activated during a predetermined interval of time until a power supply voltage reaches a predetermined voltage at power-on. The power-on reset signal is inactivated when the power supply voltage reaches the predetermined voltage. Logic circuits in a semiconductor memory device are reset to their initial states at activation of the power-on reset signal.

In the case where non-volatile memory devices are used as a boot-up memory, a read operation is carried out after a power-on reset operation is performed. A voltage detecting circuit is used that detects a power supply voltage and switches the logic state of its output signal when the power supply voltage reaches a predetermined voltage (i.e., a detection voltage). For example, if a power supply voltage reaches a detection voltage, an output signal of a power detecting circuit has a high-to-low transition, and a read operation commences when the signal transition is received by the memory chip. However, noise may be caused by an unstable state of an external power supply voltage or excessive power consumption in the chip. If this occurs, the chip power supply voltage may be suddenly lowered below the detection voltage. If the power supply voltage falls below the detection voltage, it may be raised up to the power supply voltage again. In this case, a voltage detecting circuit detects variation of a power supply voltage, and an output signal of the detecting circuit has a high-to-low transition according to a detection result. This causes the read operation to commence, even though the system was not in a power-up phase. Since low-voltage memory devices are very sensitive to noise, problems such as this abnormal read operation may become more serious.

Accordingly, a memory device capable of preventing an abnormal read operation due to noise and a power detecting circuit having improved immunity is desirable.

SUMMARY OF THE INVENTION

Embodiments of the invention provide a power detecting circuit of a non-volatile memory device capable of improving noise immunity.

Embodiments of the invention provide a memory device capable of reading out data stored in a memory cell of a non-volatile memory device without an external command signal (or an external command and an address) at power-on in any system.

Embodiments of the invention provide a method of generating a power-on reset signal and a power-on read signal.

Embodiments of the invention also provide a stable power-on reading method for a memory device.

BRIEF DESCRIPTION OF THE DRAWINGS

A more complete appreciation of the present invention, and many of the attendant advantages thereof, will become readily apparent by reference to the following detailed description when considered in conjunction with the accompanying drawings in which like reference symbols indicate the same or similar components.

DETAILED DESCRIPTION OF THE INVENTION

Figure 1:
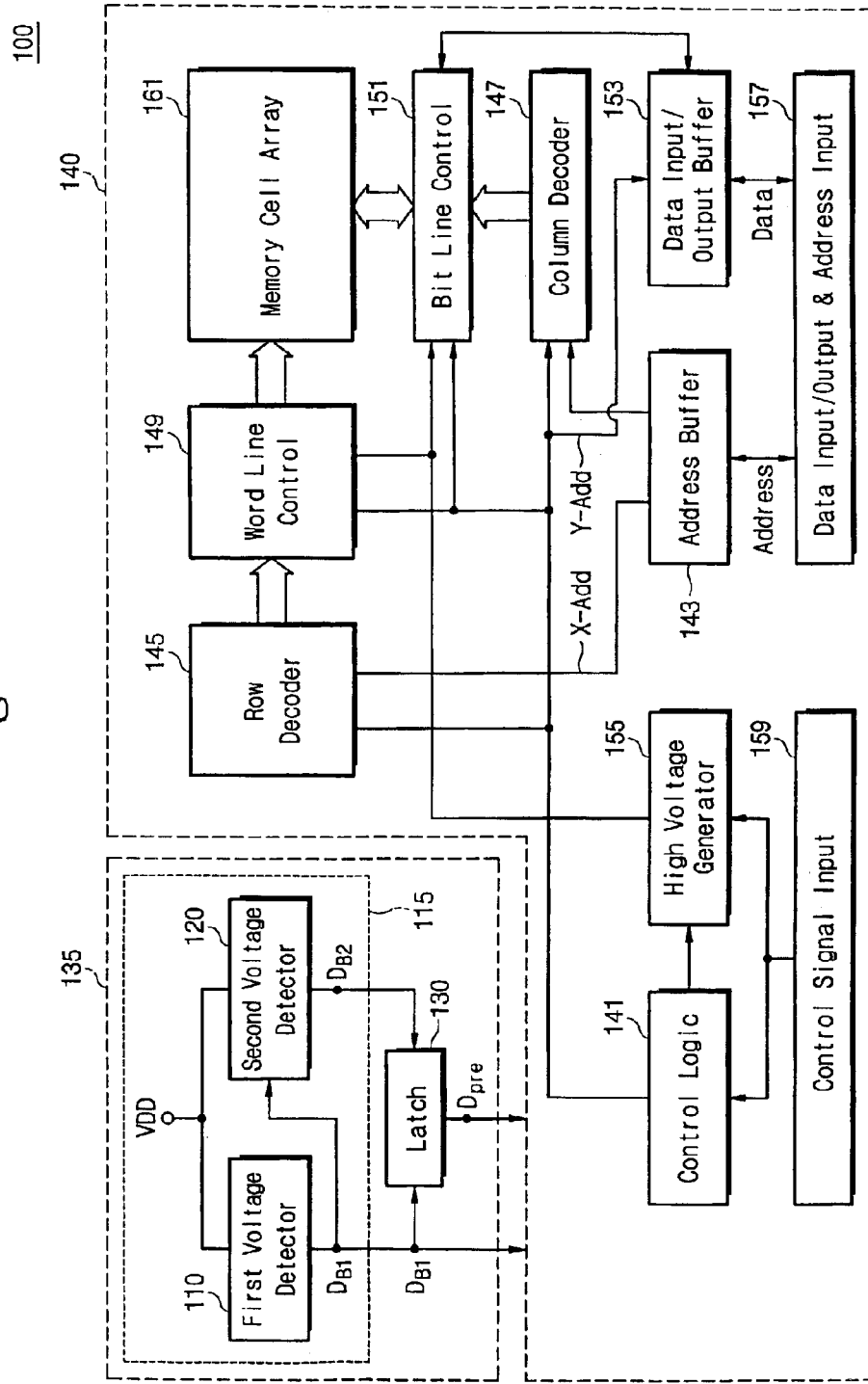
FIG. 1 is a functional block diagram of a flash memory device according to an embodiment of the present invention.

Embodiments of the invention will be more fully described with reference to the attached drawings of FIGS. 1 to 4. In the attached drawings, similar constituent elements are marked by the same or similar reference numerals or symbols, respectively.

FIG. 1 schematically shows a flash memory device 100 according to an embodiment of the invention. A flash memory device 100 includes a power detecting circuit 135 and a memory chip 140.

The flash memory device 100 in FIG. 1 can be used in any system as a boot-up memory for storing boot-up information and as a general memory for storing information except for boot-up information. In a case where the flash memory device 100 is used as the boot-up memory, if logic circuits in the memory are initialized by the power detecting circuit 135 and a power-on read signal $D_{pre}$ is enabled, an operation of reading out data (e.g., boot-up information) from a memory cell array 161 commences with reference to a previously designed algorithm. Namely, if the power-on read signal $D_{pre}$ is enabled, commands and addresses are generated in the memory chip 140 according to the previously designed algorithm. Also, if a user gives an external address command to the memory chip 140, data can be read out from the memory cell array according to the given address. After the power-on read signal $D_{pre}$ is enabled, a read operation commences only according to an input of an address without a read command. Accordingly, it is possible to perform a read operation according to a user's choice at power-on.

The power-on detecting circuit 135 according to the embodiments of the invention generates a power-on reset signal (which will be subsequently referred to as the first buffered detection signal $D_{B1}$) that resets logic circuits in a flash memory device installed on a system to an initial stable state. The power-on detecting circuit 135 further generates a power-on read signal $D_{pre}$ that triggers a power-on read operation where data is read out from specific cells of a memory cell array. The power-on read operation means that a read operation starts without a read command input when a power supply voltage VDD rises greater than a predetermined voltage after power-on.

The power detecting circuit 135 includes a voltage detecting circuit 115 and a latch circuit 130. The voltage detecting circuit 115 includes first voltage detector 110 and second voltage detector 120. The power detecting circuit 135 resets logic circuits in the memory chip 140 through the first voltage detector 110 (by generating the first buffered detection signal $D_{B1}$) when the power supply voltage VDD increases at power-on and reaches the first voltage. If the power supply voltage VDD reaches the second voltage, the power detecting circuit 135 outputs a power-on read signal $D_{pre}$ from the latch circuit 130 to trigger a power-on read operation of the memory chip 140.

The memory chip 140 includes a memory cell array 161, control logic 141 for outputting a control signal in response to the power-on read signal $D_{pre}$, an address buffer 143 for generating row and column addresses, a row decoder 145, a word line control circuit 149, a column decoder 147, a bit line control circuit 151, a data input/output buffer 153, a data input/output and address input block 157, a control signal input block 159, and a high voltage generator 155.

Control logic 141 controls the row decoder 145, the column decoder 147, the word line control circuit 149, the bit line control circuit 151, and the data input/output buffer 153 during a read operation. The row decoder 145 decodes a row address from the address buffer 143 in response to a control signal from control logic 141. The word line control circuit 149 receives a decoded row address from the row decoder 145 and a high voltage from the high voltage generator 155, and selects at least one of a number of rows in the memory cell array 161 in response to a control signal from control logic 141. In conclusion, the row decoder 145 and the word line control circuit 149 function as a row selecting circuit that selects one or more rows corresponding to a row address.

The bit line control circuit 151 receives a high voltage from the high voltage generator 155, and reads and stores data from memory cells in a row, which is selected by the row decoder 145 and the word line control circuit 149, in response to a control signal from control logic 141. The column decoder 147 decodes a column address from the address buffer 143 in response to a control signal from the control logic 141, and provides a decoded column address to the bit line control circuit 151. Data in the bit line control circuit 151 is transferred to the data input/output buffer 153 according to the decoded column address from the column decoder 147 and a control signal from control logic 141.

In the flash memory device 100, an address from the address buffer 143 can be generated by inputting an external address directly to a data input/output and address input block 157. Alternatively, an address from the address buffer 143 can be generated internally by control logic 141. In both cases, as the power-on read signal $D_{pre}$ is enabled, the power-on read operation of a memory chip 140 commences by an address input (or without an address input) and without a read command.

Figure 2:
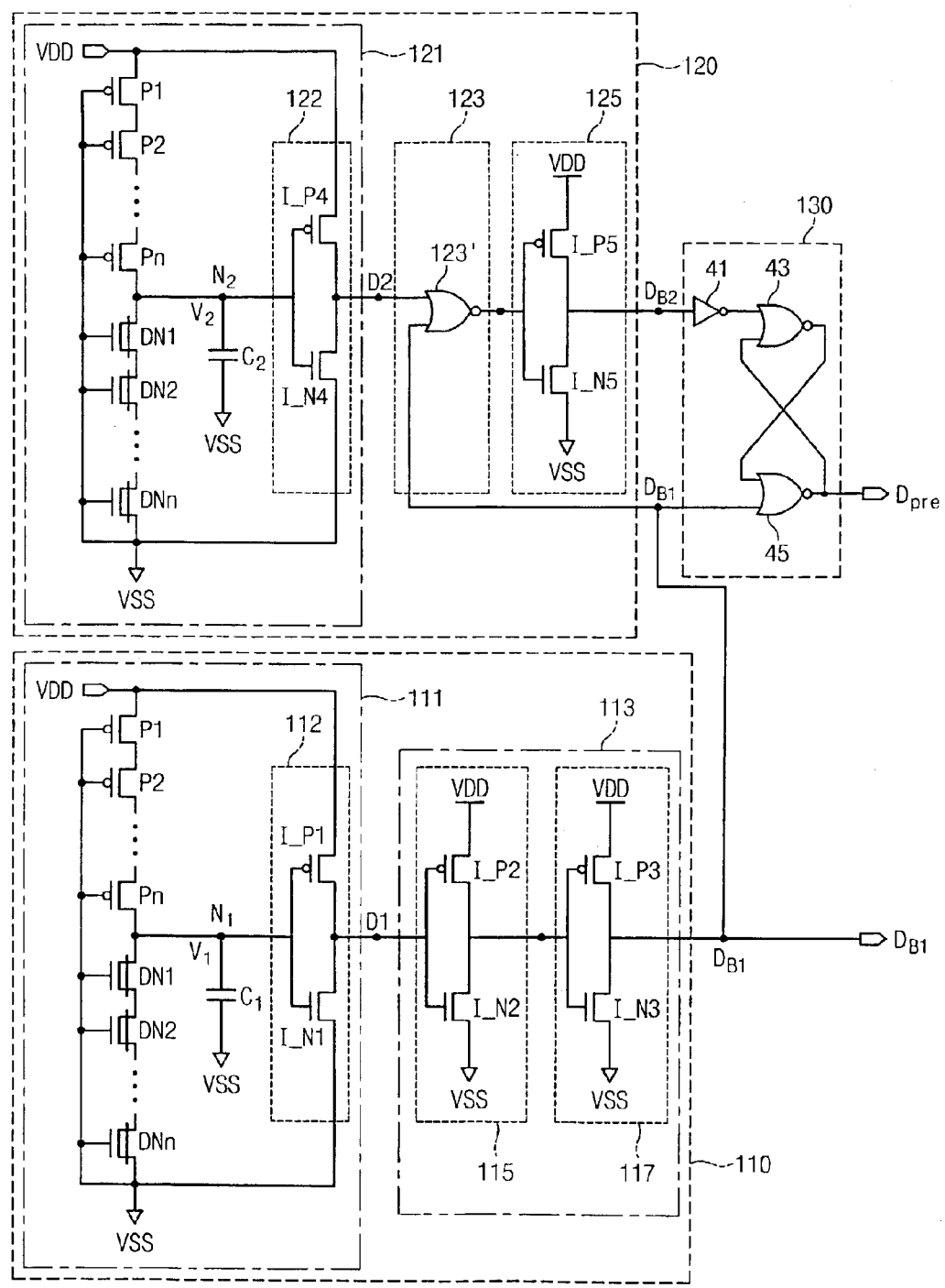
FIG. 2 is a power detecting circuit operable in the flash memory device of FIG. 1.

FIG. 2 shows an example of the power detecting circuit 135 that can be used in the memory device illustrated in FIG. 1. Referring to FIG. 2, the power detecting circuit 135 includes a first voltage detector 110 formed by a first voltage detecting circuit 111 and a first buffer circuit 113, a second voltage detector 120 formed by a second voltage detecting circuit 121, a synchronization component 123, and a second buffer circuit 125. The power detecting circuit 135 also includes a latch 130.

The first voltage detecting circuit 111 senses variation of a power supply voltage VDD, and outputs the first detection signal D1 at a logic low state when the power supply voltage VDD reaches the first voltage. The first buffer circuit 113 includes two CMOS inverters 115 and 117 that are connected in series to each other. The first buffer circuit 113 is connected to an output terminal of the first voltage detecting circuit 111 and outputs the first buffered detection signal $D_{B1}$. The first buffered detection signal $D_{B1}$ from the first voltage detector 110 triggers the power-on reset function for resetting latches and flip-flops (that is, logic circuits) in a memory chip 140, for example, control logic, a row decoder, a column decoder, and so on. The control logic 141 of the memory chip 140 operates responsive to a power-on read signal $D_{pre}$ from the latch 130, so that a power-on read operation starts.

The first voltage detecting circuit 111 includes a number of enhancement-type PMOS transistors P1–Pn connected in series between the power supply voltage VDD and the first node N1, a number of depletion-type NMOS transistors DN1–DNn connected in series between the first node N1 and a ground voltage VSS, a capacitor C1 connected between the first node N1 and the ground voltage VSS, and a CMOS inverter 112 connected between the first node N1 and the ground voltage VSS. The gates of the transistors P1–Pn and DN1–DNn are grounded. A logic threshold voltage of the inverter 112 is equal to the first voltage. The CMOS inverter 112 includes a PMOS transistor I_P1 and an NMOS transistor I_N1 connected in series between the power supply voltage VDD and the ground voltage VSS. Gates of the transistors I_P1 and I_N1 are commonly connected to the first node N1, and drains of the transistors I_P1 and I_N1 are interconnected to form an output terminal for outputting the first detection signal D1.

The first buffer circuit 113 includes two CMOS inverters 115 and 117 that are connected serially each other. The CMOS inverter 115 includes PMOS transistor I_P2 and NMOS transistor I_N2 that are connected in series between the power supply voltage VDD and the ground voltage VSS, and the CMOS inverter 117 includes PMOS transistor I_P3 and NMOS transistor I_N3 that are connected in series between the power supply voltage VDD and the ground voltage VSS. The gates of the transistors I_P2 and I_N2 are interconnected to form an input terminal that is connected with an output terminal of the first voltage detecting circuit 111, that is, an output terminal of the inverter 112. The drains of the transistors I_P2 and I_N2 are interconnected to form an output terminal of the inverter 115. Likewise, gates of the transistors I_P3 and I_N3 are interconnected to form an input terminal that is connected with an output terminal of the inverter 115. The drains of the transistors I_P2 and I_N2 are interconnected to form an output terminal for outputting the first buffered detection signal $D_{B1}$.

The second voltage detecting circuit 121 senses variation of the power supply voltage VDD, and outputs the second detection signal D2 at a logic low state when the power supply voltage VDD reaches the second voltage. The synchronization component 123 includes a NOR gate 123', which receives as inputs the first buffered detection signal $D_{B1}$ and the second detection signal D2. The second buffer circuit 125 is connected to an output of the synchronization component 123, and outputs the second buffered detection signal $D_{B2}$ that is provided to the latch 130. The second buffer circuit 125 includes one CMOS inverter.

As illustrated in FIG. 2, the second voltage detecting circuit 121 is configured the same as the first voltage detecting circuit 111. Namely, the second voltage detecting circuit 121 includes a number of PMOS transistors P1–Pn connected in series between the power supply voltage VDD and the second node N2, a number of depletion-type NMOS transistors DN1–DNn connected in series between the second node N2 and the ground voltage VSS, a capacitor C2 connected between the second node N2 and the ground voltage VSS, and a CMOS inverter 122 connected between the second node N2 and the ground voltage VSS. The gates of the transistors P1–Pn and DN1–DNn are grounded. An output of the CMOS inverter 122 is the second detection signal D2. A logic threshold voltage of the inverter 122 is equal to the second voltage. The CMOS inverter 122 includes a PMOS transistor I_P4 and an NMOS transistor I_N4. The gates of the transistors I_P4 and I_N4 are commonly connected to the second node N2, and the drains of those transistors are interconnected to form an output terminal for outputting the second detection signal D2.

In a case where the memory device operates at a low power supply voltage (e.g., 1.8V), the first voltage is 1.3V and the second voltage is 1.6V.

The depletion-type NMOS transistors DN1–DNn in the respective circuits 111 and 121 form a current-controlled resistor that allows a constant amount of current to flow into the ground voltage VSS. Accordingly, the first or second voltage has a voltage obtained by dividing the power supply voltage VDD. If the PMOS transistors P1–Pn in the respective circuits 111 and 121 are turned on according to the increase of the power supply voltage VDD, the capacitors C1 and C2 are charged.

The latch 130 outputs a power-on read signal $D_{pre}$ in response to the first buffered detection signal $D_{B1}$ and the second buffered detection signal $D_{B2}$. According to this embodiment, the latch 130 includes an inverter 41 and first and second NOR gates 43 and 45. The inverter 41 has its input terminal connected to receive the second buffered detection signal $D_{B2}$. The first NOR gate 43 has a first input terminal connected to an output terminal of the inverter 41. The second NOR gate 45 has a first input terminal connected to receive the first buffered detection signal $D_{B1}$, a second input terminal connected to an output terminal of the first NOR gate 43, and an output terminal connected to the second input terminal of the first NOR gate 43.

The operation of the power detecting circuit 135 according to the embodiment of the invention will be more fully described below.

At power-off where a power supply voltage VDD is not supplied, that is, when the power supply voltage VDD is 0V, since voltages of the first node N1 and an output terminal of the inverter 112 have a ground voltage VSS, a voltage of the first detection signal D1 is 0V. Namely, the first buffered detection signal $D_{B1}$ from the first buffer means 113 is at 0V, the ground voltage VSS. As the power supply voltage VDD is gradually increased, the PMOS transistors P1–Pn of the first voltage detecting circuit 111 are turned on. As charges are transferred to a capacitor C1 through the turned-on transistors P1–Pn, a voltage $V_1$ of the first node N1 follows the power supply voltage VDD. At this time, a PMOS transistor I_P3 of the inverter 117 in the first buffer circuit 113 is turned on, so that the first buffered detection signal $D_{B1}$ follows the power supply voltage VDD. When the power supply voltage VDD reaches the first voltage, a voltage of the first node N1 becomes a logic threshold voltage of the inverter 112. This causes an NMOS transistor I_N1 to be turned on. Thus, the first detection signal D1 has a logic low state and the buffer circuit 113 outputs the first buffered detection signal $D_{B1}$ at a logic low state.

Meanwhile, an output signal $D_{B2}$ of the second voltage detector 120 has the same logic state (i.e., logic '1') as an output signal $D_{B1}$ of the first voltage detector 110 in a range where the power supply voltage VDD is lower than the first voltage. The reason is because the first buffered detection signal $D_{B1}$, the output signal from the first voltage detector 110, is supplied to the NOR gate 123' in the synchronization means 123 of the second voltage detector 120.

In particular, if the power supply voltage VDD is not supplied, that is, when the power supply voltage VDD is 0V, the second detection signal D2 is 0V, because the voltages of the second node N2 and an output terminal of the inverter 122 are both at the ground voltage. As previously described, when the power supply voltage VDD is 0V, the first buffered detection signal $D_{B1}$ is also at the ground voltage VSS. For this reason, the output of the NOR gate 123' has a logic high state. Accordingly, the second buffered detection signal $D_{B2}$ from the second buffer circuit 125 is at the ground voltage VSS. As the power supply voltage VDD gradually increases, the PMOS transistors P1–Pn of the second voltage detecting circuit 121 are turned on and charge is supplied to the capacitor C2 connected to the second node N2. This allows a voltage V2 of the second node N2 to follow the power supply voltage VDD. Since the first buffered detection signal $D_{B1}$ following the power supply voltage VDD indicates a logic high level, an output signal of the NOR gate 123' becomes low (i.e., 0V). As the PMOS transistor I_P5 of the inverter in the second buffer circuit 125 is turned on, the second buffered detection signal $D_{B2}$ follows the power supply voltage VDD and has the same logic state as the first buffered detection signal $D_{B1}$. In other words, when the power supply voltage VDD is lower than the first voltage, the first and second buffered detection signals $D_{B1}$ and $D_{B2}$ have the same logic state.

As the power supply voltage VDD continues to increase, a voltage V2 of the second node N2 increases by accumulation of charges in the capacitor C2. This means that the PMOS transistor I_P5 of the inverter 125 is turned on so that the second buffered detection signal $D_{B2}$ follows the power supply voltage VDD. If the power supply voltage VDD reaches the second voltage, an NMOS transistor I_N4 of an inverter 122 is turned on, and the second detection signal D2 is at a logic low state. The second detection signal D2 is supplied to one input terminal of the NOR gate 123'. At this time, the first voltage detector 110 outputs the first buffered detection signal $D_{B1}$ at a logic low state, which is supplied to the other input terminal of the NOR gate 123'. The NOR gate 123' outputs a signal at a logic high state in response to its input signals. That is, the first buffered detection signal $D_{B1}$ has a logic low state and the second detection signal D2 has a logic low state. Accordingly, the second buffer means 125 outputs the second buffered detection signal $D_{B2}$ at a logic low state.

An output signal of the latch means 130, that is, the power-on read signal $D_{pre}$, has its logic state determined by output signals of the first and second voltage detectors 110 and 120, that is, the first and second buffered detection signals $D_{B1}$ and $D_{B2}$.

Figure 3A:
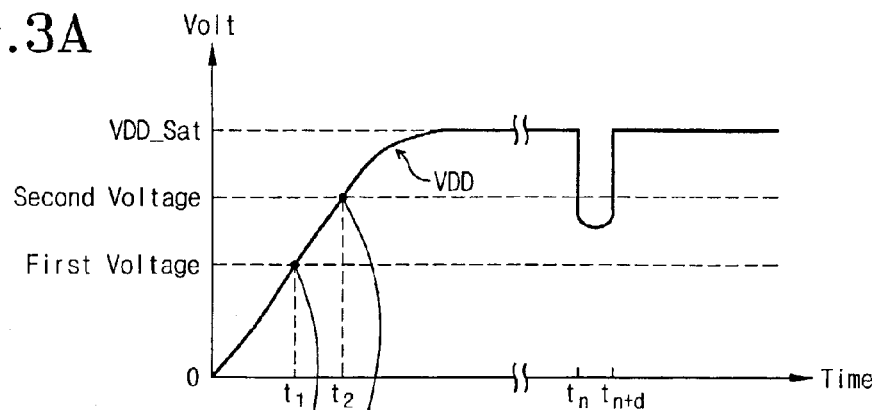
FIGS. 3A, 3B, and 3C are timing diagrams illustrating example voltages from the power detecting and latch circuits of FIG. 2 as a function of time.
Figure 3B:
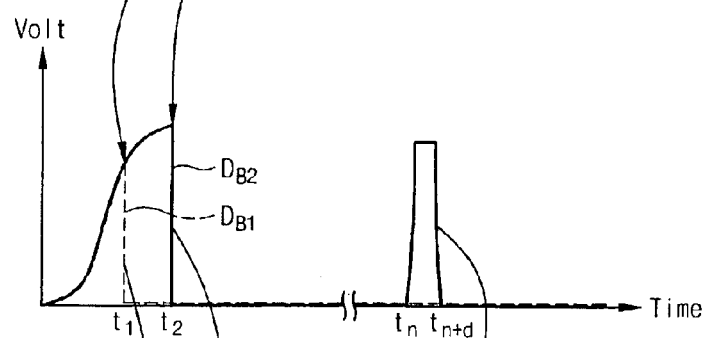
Figure 3C:
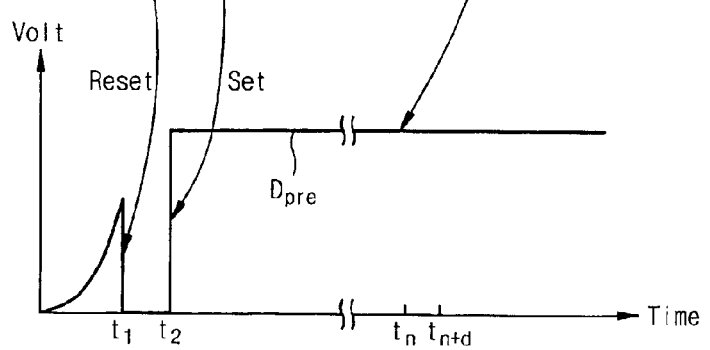

FIGS. 3A, 3B, and 3C are timing diagrams illustrating the variation of the power supply voltage VDD, the first and second buffered detection signals $D_{B1}$ and $D_{B2}$, and the power-on read signal $D_{pre}$, respectively, of the power detecting and latch circuits of FIG. 2.

As explained above and with reference to FIGS. 3A and 3B, before the power supply voltage VDD reaches the first voltage, that is, before a time t1, the first and second buffered detection signals $D_{B1}$ and $D_{B2}$ have the same logic state, a logic high state (refer to FIG. 3B). Since the second buffered detection signal $D_{B2}$ at a logic high state is provided to the first NOR gate 43 via the inverter 41 of the latch 130 and the first buffered detection signal $D_{B1}$ at a logic high state is provided directly to the second NOR gate 45, the latch 130 is reset so that a power-on read signal $D_{pre}$ at a logic low state is output.

As illustrated in FIGS. 3A and 3B, at a time t1 when the power supply voltage VDD reaches the first voltage, the first buffered detection signal $D_{B1}$ transitions from a logic high state to a logic low state. As the latch 130 maintains its initial state, that is, a reset state, the power-on read signal $D_{pre}$ is maintained at a logic low state (FIG. 3C). At this time, the latches and flip-flops in the memory chip 140 are maintained at an initial stable state by the first buffered detection signal $D_{B1}$ being at a logic low state.

At a time t2 when the power supply voltage VDD reaches the second voltage, the second buffered detection signal $D_{B2}$ transitions from a logic high state to a logic low state (FIG. 3B). The second buffered detection signal $D_{B2}$ at a logic low state is provided to the first NOR gate 43 via inverter 41 of latch 130, and the first buffered detection signal $D_{B1}$ at a logic low state is provided to the second NOR gate 45. The state of the latch 130 transitions to a set state from the reset state, causing the power-on read signal $D_{pre}$ to transition from a logic low state to a logic high state (FIG. 3C). Accordingly, the power-on read operation of the memory chip commences.

In short, the first voltage detector 110 outputs a power-on reset signal, that is, the first buffered detection signal $D_{B1}$, at a logically activated state before the power supply voltage reaches the first voltage. When the power supply voltage VDD reaches the first voltage, the power-on reset signal (first buffered detection signal $D_{B1}$) is logically inactivated. Herein, a logically activated state is a logic high state (logic '1'), and a logically inactivated state is a logic low state (logic '0'). Likewise, the second voltage detector 120 outputs the second buffered detection signal $D_{B2}$ at a logically activated state before the power supply voltage VDD reaches the second voltage. When the power supply voltage VDD reaches the second voltage, the second buffered detection signal $D_{B2}$ is logically inactivated. Also, in a case where the power supply voltage VDD is lower than the first voltage, output signals of the first and second voltage detectors 110 and 120 have the same logic state.

If the power supply voltage VDD reaches the first voltage, the latch 130 is reset, placing the power-on read signal $D_{pre}$ in an inactive state. If the power supply voltage VDD reaches the second voltage, the latch 130 is set, placing the power-on read signal $D_{pre}$ in an active state. When the signal $D_{pre}$ is activated, the power-on read operation of the memory chip commences.

Again referring to FIGS. 3A–3C, it is assumed that noise arises at a time $t_n$ after the power supply voltage VDD reaches a stable voltage level VDD_sat. The power supply voltage VDD is lowered below the second voltage owing to the noise, but recovers at the stable voltage level VDD_sat at a time $t_{n+d}$. The second buffered detection signal $D_{B2}$ transitions from a logic low state to a logic high state at the time $t_n$, and again transitions from a logic high state to a logic low state at the time $t_{n+d}$. However, if the logic state of the first buffered detection signal $D_{B1}$ is not changed, the state variation of the second buffered detection signal $D_{B2}$ is unable to change an output state of the latch means 130.

In the above embodiment, a NOR gate 123' used as the synchronization component 123 in the second voltage detector 120 may alternatively be replaced with a CMOS inverter. In that case, the first buffered detection signal $D_{B1}$ from the first voltage detector 110 is not supplied to the second voltage detector 120.

Figure 4:
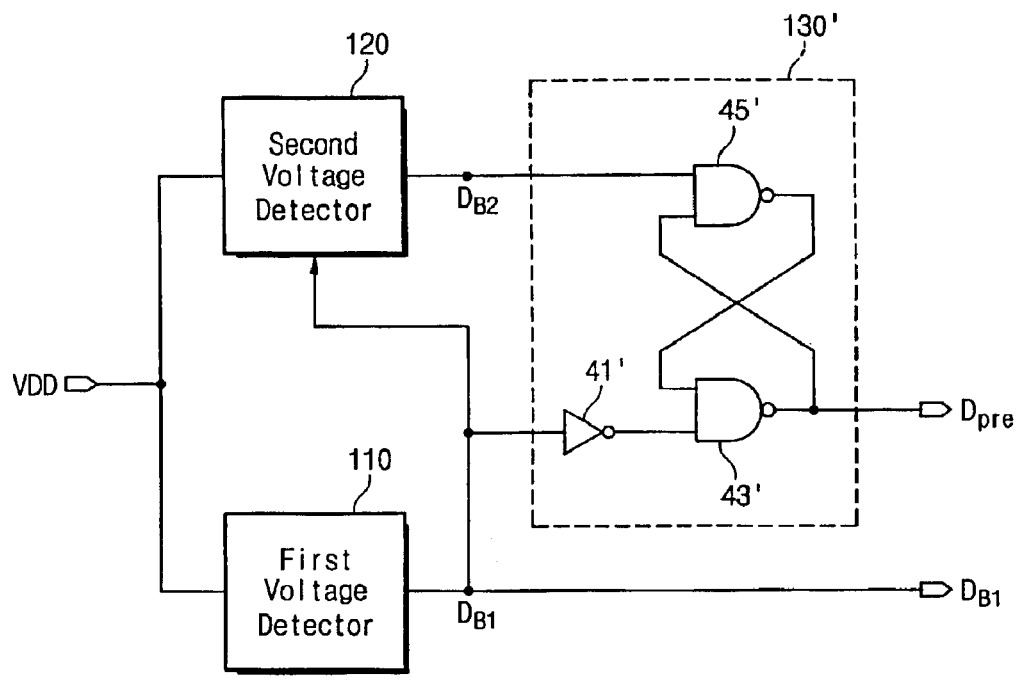
FIG. 4 is a circuit diagram illustrating another latch circuit that may be used with the flash memory device of FIG. 1.

Alternatively, a latch 130' may also be configured as illustrated in FIG. 4. The latch 130' includes an inverter 41' having its input terminal connected to receive the first buffered detection signal $D_{B1}$; a first NAND gate 43' having a first input terminal connected to an output of the inverter 41'; a second NAND gate 45' having a first input terminal connected to receive the second buffered detection signal $D_{B2}$, a second input terminal connected to an output terminal of the first NAND gate 43', and an output terminal connected to a second input terminal of the first NAND gate 43'. The latch 130' in FIG. 4 operates the same as the latch 130 in FIG. 2, so a detailed description is omitted.

According to embodiments of the invention, the power detecting circuit simultaneously generates a power-on reset signal for resetting logic circuits in a memory chip and a power-on read signal for triggering a read operation of the memory chip. When a power supply voltage is lower than the first voltage after power-on, the power detecting circuit generates a power-on reset signal that follows the power supply voltage. When the power supply voltage is lower than the first voltage, the power detecting circuit generates a detection signal at the same logic state as the power-on reset signal. When the power supply voltage is lower than the second voltage but is higher than the first voltage, the power detecting circuit generates a detection signal that follows the power supply voltage. The power-detecting circuit generates a power-on read signal in response to the power-on reset signal and the detection signal. At this time, the power-on read signal has a logically inactivated state when the power supply voltage is lower than the first voltage, and has a logically activated state when the power supply voltage is higher than the second voltage.

Specific embodiments of tine invention will now be discussed.

In accordance with an embodiment of the invention, there is provided a power detecting circuit which initializes logic circuits in a flash memory chip and starts a stable read operation of the memory device at power-on. The power detecting circuit includes a first voltage detector, a second voltage detector, and a latch. The first voltage detector includes a first voltage detecting circuit for outputting the first detection signal in response to the variation of a power supply voltage, and a first buffering circuit connected to the first voltage detecting circuit to output the first buffered detection signal. The second voltage detector includes a second voltage detecting circuit for outputting the second detection signal in response to variation of the power supply voltage, and a second buffering circuit connected to the second voltage detecting circuit to output the second buffered detection signal. The latch is set or reset by the first and second buffered detection signals. The first buffered detection signal that is output from the first voltage detector is used as a power-on reset signal for resetting the logic circuits.

When the power supply voltage reaches a first voltage, the first buffered detection signal has a state transition, so that the logic circuits are reset. When the power supply voltage reaches a second voltage, the second buffered detection signal has a state transition. The latch is set to trigger a power-on read operation after the state transition of the second buffered detection signal.

In particular, the first buffered detection signal follows the power supply voltage and has a logically activated state (logic high or logic '1') before the power supply voltage reaches the first voltage. The first buffered detection signal transitions to a logically inactivated state (logic low or logic '0') after the power supply voltage reaches the first voltage. In other words, the first detection signal from the first voltage detecting circuit becomes low when the power supply voltage reaches the first voltage, and the first buffer buffers the first detection signal to output the first buffered detection signal at a logic low state. Thus the logic circuits are reset to an initial stable state.

The second buffered detection signal follows the power supply voltage and has a logically activated state (logic high or logic '1') before the power supply voltage reaches the second voltage. The second buffered detection signal becomes inactive (logic low or logic '0') when the power supply voltage reaches the second voltage. At this time, the latch is set to output the power-on read signal at an active state, which is provided to a memory chip.

In this embodiment, each of the first and second voltage detecting circuits includes a number of PMOS transistors which are connected in series between the power supply voltage and a first node, the gates of the PMOS transistors grounded; a number of depletion-type NMOS transistors which are connected in series between the first node and the ground voltage, the gates of the depletion-type NMOS transistors grounded; a capacitor that is connected between the first node and the ground voltage; and an inverter that is connected to the first node. A logic threshold voltage of the inverter of the first voltage detecting circuit is equal to the first voltage, and a logic threshold voltage of the inverter of the second voltage detecting circuit is equal to the second voltage. The first buffer and the second buffer include two serially-connected CMOS inverters.

Preferably, before the power supply voltage reaches the first voltage level, the first and the second buffered detection signals are at the same logic state.

The first voltage detector includes a first voltage detecting circuit that detects the power supply voltage and produces a first detection signal; and a first buffer circuit that has as its input the first detection signal and outputs a first buffered detection signal that is supplied to a first input terminal of the latch means. The first buffered detection signal is supplied to a number of logic circuits.

The second voltage detector includes a second voltage detecting circuit which detects the power supply voltage and produces a second detection signal; a synchronization circuit that has as inputs the second detection signal and the first buffered detection signal; and a second buffer circuit that has as its input an output of the synchronization circuit and outputs a second buffered detection signal that is supplied to a second input terminal of the latch.

Because of the synchronization means, if the power supply voltage is lower than the first voltage, the first and second buffered detection signals have the same logic state, that is, they follow the power supply voltage. During this time, the logic circuits are reset. If the power supply voltage is lower than the second voltage, the second buffered detection signal follows the power supply voltage.

In this embodiment, the latch includes a first NOR gate that has a first input terminal connected to receive the second buffered detection signal, a second input terminal, and an output terminal; an inverter that has an input terminal connected to receive the first buffered detection signal and an output terminal; and a second NOR gate that has a first input terminal connected to the output terminal of the inverter, a second input terminal connected to the output terminal of the first NOR gate, and an output terminal connected to the second input terminal of the first NOR gate.

In this embodiment, before the power supply voltage reaches the first voltage, the first and second buffered detection signals are synchronized with each other to have the same logic state. During this period, the latch is stably reset. That is, before the power supply voltage reaches the first voltage, the first and second buffered detection signals have a logic high state and follow the power supply voltage. At this time, the second buffered detection signal is inverted by the inverter included in the latch, and the latch is reset.

In an alternative embodiment, the latch includes a first NAND gate which has a first input terminal connected to receive the second buffered detection signal, a second input terminal, and an output terminal; an inverter which has an input terminal connected to receive the first buffered detection signal and an output terminal; and a second NAND gate which has a first input terminal connected to the output terminal of the inverter, a second input terminal connected to the output terminal of the first NAND gate, and an output terminal connected to the second input terminal of the first NAND gate.

According to embodiments of the invention, if a power-on read operation commences followed by power noise, the latch is not set again as long as the power supply voltage remains above the first voltage. The power detecting circuit stably triggers a power-on read operation and provides a power-on reset function. Since the first and second buffered detection signals provided to the latch have the same logic state when the power supply voltage is lower than the first voltage, the latch is stably reset when the power supply voltage is lower than the first voltage related to a power-on reset operation.

According to other embodiments of the invention, a flash memory device is provided that includes a first voltage detector that outputs a first signal of a disable state when a power supply voltage reaches a first voltage; a second voltage detector that outputs a second signal of a disable state when the power supply voltage reaches a second voltage, the second voltage being higher than the first voltage; a latch which generates a power-on read signal for triggering a power-on read operation in response to the first and second signals; a memory cell array that has a number of memory cells arranged in a matrix of rows and columns; an address generator that generates row and column addresses; control logic that generates a control signal in response to the power-on read signal; and a read circuit that reads out from the memory cell array in response to the addresses from the address generating means and the control signal from the control logic. The latch produces a reset signal in response to the first signal and a set signal in response to the second signal, so that the power-on read operation commences.

In the flash memory device according to embodiments of the invention, addresses from the address generating can be generated by an external address command. Accordingly, in a case where the flash memory device is used in any system, it is capable of reading out data at power-on. Addresses from the address generator can also be generated internally by the control logic. In that case, the flash memory device may be used as a boot-up memory for any system.

In accordance with still other embodiments of the invention, a method for generating a power-on reset signal for resetting logic circuits in a flash memory device and a power-on read signal for triggering a read operation of the memory device is, provided. The method includes generating the power-on reset signal that follows a power supply voltage when the power supply voltage is lower than a first voltage at power-on; generating a detection signal; and generating the power-on read signal in response to the power-on reset signal and the detection signal. The detection signal is at the same logic state as the power-on reset signal when the power supply voltage is lower than the first voltage, and the detection signal follows the power supply voltage when the power supply voltage is lower than a second voltage, where the second voltage is greater than the first voltage. The power-on read signal has a logically inactivated state when the power supply voltage is less than the first voltage and a logically activated state when the power supply voltage is greater than the second voltage.

In accordance with yet other embodiments of the invention, a method for reading a memory device at power-on that operates stably in the presence of noise is provided. The method includes generating a power-on reset signal that follows a power supply voltage when the power supply voltage is lower than a first voltage after power-on; generating a detection signal; generating a power-on read signal in response to the power-on reset signal and the detection signal; and reading out data from a memory cell array in response to an address generated by an external address command. The power-on read signal has a logically activated state when the power supply voltage is higher than a second voltage, the second voltage is greater than the first voltage. The detection signal indicates the same logic state as the power-on reset signal when the power supply voltage is less than the first voltage, and the detection signal follows the power supply voltage when the power supply voltage is less than the second voltage. The power-on read signal is logically re-activated only when the power supply voltage falls below the first voltage due to power noise and then returns to the level of the second voltage.

In accordance with embodiments of the invention, unnecessary power-on read operations of a memory device caused by power noise are prevented. Thus, power consumption of a system may be reduced.

The invention has been described using exemplary embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A power detecting circuit which initializes logic circuits in a flash memory chip at power-on and commences a stable read operation of the flash memory device, comprising:
    a latch having a first input terminal, a second input terminal, and an output terminal connected to the memory chip, the output terminal outputting a power-on read signal for triggering a read operation of the memory chip; and
    a voltage detector connected to the first and second input terminals of the latch and the logic circuits,
wherein when a power supply voltage is lower than a first voltage the voltage detector resets the latch so that the power-on read signal is established to a logically inactivated state, and initializes the logic circuits;
and wherein when the power supply voltage is over a second voltage higher than the first voltage, the voltage detector sets the latch so that the power-on read signal is established to a logically activated state to trigger the stable read operation.

2. The power detecting circuit according to claim 1, wherein the voltage detector includes:
    a first voltage detecting circuit which detects the power supply voltage to output a first detection signal;
    a first buffer which is connected to an output of the first voltage detecting circuit and outputs a first buffered detection signal to be supplied to the first input terminal of the latch;
    a second voltage detecting circuit which detects the power supply voltage to output a second detection signal; and
    a second buffer which is connected to an output of the second voltage detecting circuit and outputs a second buffered detection signal to be supplied to the second input terminal of the latch,
    wherein the first buffered detection signal is provided to the logic circuits; wherein when the power supply voltage is lower than the first voltage the first buffered detection signal follows the power supply voltage, with the logic circuits reset by the first buffered detection signal; and wherein when the power supply voltage is lower than the second voltage, the second buffered detection signal follows the power supply voltage.

3. The power detecting circuit according to claim 2, wherein the first buffered detection signal has a logically inactivated state when the power supply voltage is over the first voltage, and the second buffered detection signal has a logically inactivated state when the power supply voltage is over the second voltage, the logically inactivated state being a logic low state and the logically activated state being a logic high state.

4. The power detecting circuit according to claim 2, wherein the latch includes:
    an inverter which has an input terminal connected to receive the second buffered detection signal, and an output terminal;
    a first NOR gate which has a first input terminal connected to the output terminal of the inverter, a second input terminal, and an output terminal; and
    a second NOR gate which has a first input terminal connected to receive the first buffered detection signal, a second input terminal connected to the output terminal of the first NOR gate, and an output terminal connected to the second input terminal of the first NOR gate.

5. The power detecting circuit according to claim 4, wherein the first buffered detection signal has a logically inactivated state when the power supply voltage is over the first voltage, and the second buffered detection signal has a logically inactivated state when the power supply voltage is over the second voltage, the logically inactivated state being a logic low state and the logically activated state being a logic high state.

6. The power detecting circuit according to claim 2, wherein the latch includes:
    a first NAND gate which has a first input terminal connected to receive the second buffered detection signal, a second input terminal, and an output terminal;
    an inverter which has an input terminal connected to receive the first buffered detection signal, and an output terminal; and a second NAND gate which has a first input terminal connected to the output terminal of the inverter, a second input terminal connected to the output terminal of the first NAND gate, and an output terminal connected to the second input terminal of the first NAND gate.

7. The power detecting circuit according to claim 2, wherein each of the first and second voltage detecting circuits includes:
   a plurality of PMOS transistors which are connected in series between the power supply voltage and a first node, gates of the PMOS transistors being grounded;
   a plurality of depletion-type NMOS transistors which are connected in series between the first node and the ground voltage, gates of the depletion-type NMOS transistors being grounded;
   a capacitor which is connected between the first node and the ground voltage; and
   an inverter which is connected to the first node,
   wherein a logic threshold voltage of the inverter of the first voltage detecting circuit is equal to the first voltage, and a logic threshold voltage of the inverter of the second voltage detecting circuit is equal to the second voltage; and
   wherein the first buffer and the second buffer each include two serially-connected CMOS inverters.

8. The power detecting circuit according to claim 1, wherein the voltage detector includes:
   a first voltage detecting circuit which detects the power supply voltage to output a first detection signal;
   a first buffer which is connected to an output of the first voltage detecting circuit and outputs a first buffered detection signal to be supplied to the first input terminal of the latch;
   a second voltage detecting circuit which detects the power supply voltage to output a second detection signal;
   a synchronization circuit connected to outputs of the first and second voltage detecting circuits; and
   a second buffer which is connected to an output of the synchronization circuit and outputs a second buffered detection signal to be supplied to the second input terminal of the latch,
   wherein the first buffered detection signal is provided to the logic circuits; wherein when the power supply voltage is lower than the first voltage the first buffered detection signal has the same logic state as the second buffered detection signal and follows the power supply voltage, with the logic circuits reset by the first buffered detection signal; and wherein when the power supply voltage is lower than the second voltage the second buffered detection signal follows the power supply voltage.

9. The power detecting circuit according to claim 8, wherein the first buffered detection signal has a logically inactivated state when the power supply voltage is over the first voltage, and the second buffered detection signal has a logically inactivated state when the power supply voltage is over the second voltage, the logically inactivated state being a logic low state and the logically activated state being a logic high state.

10. The power detecting circuit according to claim 8, wherein the latch includes:
    an inverter which has an input terminal connected to receive the second buffered detection signal, and an output terminal;
    a first NOR gate which has a first input terminal connected to the output terminal of the inverter, a second input terminal, and an output terminal; and
    a second NOR gate which has a first input terminal connected to receive the first buffered detection signal, a second input terminal connected to the output terminal of the first NOR gate, and an output terminal connected to the second input terminal of the first NOR gate.

11. The power detecting circuit according to claim 10, wherein the first buffered detection signal has a logically inactivated state when the power supply voltage is over the first voltage, and the second buffered detection signal has a logically inactivated state when the power supply voltage is over the second voltage, the logically inactivated state being a logic low state and the logically activated state being a logic high state.

12. The power detecting circuit according to claim 8, wherein the latch includes:
    a first NAND gate which has a first input terminal connected to receive the second buffered detection signal, a second input terminal, and an output terminal;
    an inverter which has an input terminal connected to receive the first buffered detection signal, and an output terminal; and
    a second NAND gate which has a first input terminal connected to the output terminal of the inverter, a second input terminal connected to the output terminal of the first NAND gate, and an output terminal connected to the second input terminal of the first NAND gate.

13. The power detecting circuit according to claim 8, wherein each of the first and second voltage detecting circuits includes:
    a plurality of PMOS transistors which are connected in series between the power supply voltage and a first node, gates of the PMOS transistors being grounded;
    a plurality of depletion-type NMOS transistors which are connected in series between the first node and the ground voltage, gates of the depletion-type NMOS transistors being grounded;
    a capacitor which is connected between the first node and the ground voltage; and
    an inverter which is connected to the first node,
    wherein a logic threshold voltage of the inverter of the first voltage detecting circuit is equal to the first voltage, and a logic threshold voltage of the inverter of the second voltage detecting circuit is equal to the second voltage; and
    wherein the first buffer is formed of two serially-connected CMOS inverters, the synchronization circuit is formed of a NOR gate, and the second buffer is formed of an inverter for receiving an output signal of the NOR gate.

14. A power detecting circuit which initializes logic circuits in a flash memory chip at power-on and allows for a read operation of the memory device, comprising:
    first and second voltage detecting circuits which detect a power supply voltage to output a first detection signal and a second detection signal, respectively;
    a first buffer which is connected to an output of the first voltage detecting circuit and outputs a first buffered detection signal;
    a synchronization circuit which is connected to outputs of the first buffer and the second voltage detecting circuit;

a second buffer which is connected to an output of the synchronization circuit and outputs a second buffered detection signal; and a latch circuit which outputs a power-on read signal in response to the first and second buffered detection signals, the power-on read signal and the first buffered detection signal being supplied to the flash memory device, wherein when the power supply voltage is lower than a first voltage, the first buffered detection signal follows the power supply voltage and resets the logic circuits and the latch circuit, the power-on read signal having a logically inactivated state according to a reset state of the latch circuit;

wherein when the power supply voltage is higher than the first voltage and lower than a second voltage, the first buffered detection signal has a logically inactivated state and the second buffered detection signal follows the power supply voltage, the second voltage being higher than the first voltage; and wherein when the power supply voltage is over the second voltage, the second buffered detection signal has a logically inactivated state so as to set the latch circuit, with the power-on read signal having a logically activated state according to a set state of the latch circuit.

15. The power detecting circuit according to claim 14, wherein the latch circuit includes:

an inverter which has an input terminal connected to receive the second buffered detection signal, and an output terminal;

a first NOR gate which has a first input terminal connected to the output terminal of the inverter, a second input terminal, and an output terminal; and a second NOR gate which has a first input terminal connected to receive the first buffered detection signal, a second input terminal connected to the output terminal of the first NOR gate, and an output terminal connected to the second input terminal of the first NOR gate.

16. The power detecting circuit according to claim 15, wherein each of the first and second voltage detecting circuits includes:

a plurality of PMOS transistors which are connected in series between the power supply voltage and a first node, gates of the PMOS transistors being grounded;

a plurality of depletion-type NMOS transistors which are connected in series between the first node and the ground voltage, gates of the depletion-type NMOS transistors being grounded;

a capacitor which is connected between the first node and the ground voltage; and an inverter which is connected to the first node, wherein a logic threshold voltage of the inverter of the first voltage detecting circuit is equal to the first voltage, and a logic threshold voltage of the inverter of the second voltage detecting circuit is equal to the second voltage;

wherein the first buffer is formed of two serially-connected CMOS inverters, the synchronization circuit is formed of a NOR gate, and the second buffer is formed of an inverter for receiving an output signal of the NOR gate; and wherein when the power supply voltage is lower than the first voltage the first and second buffered detection signals have the same logic state.

17. The power detecting circuit according to claim 14, wherein the latch circuit includes:

a first NAND gate which has a first input terminal connected to receive the second buffered detection signal, a second input terminal, and an output terminal;

an inverter which has an input terminal connected to receive the first buffered detection signal, and an output terminal; and a second NAND gate which has a first input terminal connected to the output terminal of the inverter, a second input terminal connected to the output terminal of the first NAND gate, and an output terminal connected to the second input terminal of the first NAND gate.

18. The power detecting circuit according to claim 17, wherein each of the first and second voltage detecting circuits includes:

a plurality of PMOS transistors which are connected in series between the power supply voltage and a first node, gates of the PMOS transistors being grounded;

a plurality of depletion-type NMOS transistors which are connected in series between the first node and the ground voltage, gates of the depletion-type NMOS transistors being grounded;

a capacitor which is connected between the first node and the ground voltage; and an inverter which is connected to the first node, wherein a logic threshold voltage of the inverter of the first voltage detecting circuit is equal to the first voltage, and a logic threshold voltage of the inverter of the second voltage detecting circuit is equal to the second voltage;

wherein the first buffer is formed of two serially-connected CMOS inverters, the synchronization circuit is formed of a NOR gate, and the second buffer is formed of an inverter for receiving an output signal of the NOR gate; and wherein when the power supply voltage is lower than the first voltage the first and second buffered detection signals have the same logic state.

19. A flash memory device comprising:

a first voltage detector which outputs a first signal of a disable state when a power supply voltage reaches a first voltage;

a second voltage detector which outputs a second signal of a disable state when the power supply voltage reaches a second voltage, the second voltage being higher than the first voltage;

a latch which generates a power-on read signal for triggering a power-on read operation in response to the first and second signals;

a memory cell array which has a plurality of memory cells arranged in a matrix of rows and columns;

an address generator which generates row and column addresses;

a set of control logic which generates a control signal in response to the power-on read signal; and a read circuit which reads out from the memory cell array in response to the addresses from the address generating means and the control signal from the control logic, wherein the latch outputs a reset signal in response to the first signal and a set signal in response to the second signal, so that the power-on read operation commences.

20. The flash memory device according to claim 19, wherein the first voltage detector includes a first voltage detecting circuit which detects the power supply voltage to output a first detection signal; and a first buffer which is connected to an output of the first voltage detecting circuit to output the first signal, and the second voltage detector includes a second voltage detecting circuit which detects the power supply voltage to output a second detection signal; a synchronization circuit which is connected to the first voltage detecting circuit and the second voltage detecting circuit; and a second buffer which is connected to the synchronization circuit to output the second signal, wherein when the power supply voltage is lower than the first voltage the first and second signals have the same logic state and follow the power supply voltage, with logic circuits of the memory device being reset; and wherein when the power supply voltage is over the first voltage the first and second signals have a logic low state; when the power supply voltage is lower than the second voltage the second signal follows the power supply voltage; and when the power supply voltage is over the second voltage the second signal has a logic low state.

21. The flash memory device according to claim 20, wherein each of the first and second voltage detecting circuits includes:

a plurality of PMOS transistors which are connected in series between the power supply voltage and a first node, gates of the PMOS transistors being grounded;

a plurality of depletion-type NMOS transistors which are connected in series between the first node and the ground voltage, gates of the depletion-type NMOS transistors being grounded;

a capacitor which is connected between the first node and the ground voltage; and an inverter which is connected to the first node, wherein a logic threshold voltage of the inverter of the first voltage detecting circuit is equal to the first voltage, and a logic threshold voltage of the inverter of the second voltage detecting circuit is equal to the second voltage; and wherein the first buffer is formed of two serially-connected CMOS inverters, the synchronization circuit is formed of a NOR gate, and the second buffer is formed of an inverter for receiving an output signal of the NOR gate.

22. The flash memory device according to claim 21, wherein the latch includes:

a first NAND gate which has a first input terminal connected to the second signal, a second input terminal, and an output terminal;

an inverter which has an input terminal connected to the first signal, and an output terminal; and a second NAND gate which has a first input terminal connected to the output terminal of the inverter, a second input terminal connected to the output terminal of the first NAND gate, and an output terminal connected to the second input terminal of the first NAND gate.

23. The flash memory device according to claim 19, wherein the read circuit includes:

a row selector which selects at least one of the rows in response to a row address from the address generator;

a bit line control circuit which senses and stores data from memory cells in the selected row; and a column decoder which selects one or more ones of the columns in response to a column address from the address generator and transfers into a data input/output buffer data in the bit line control circuit corresponding to the selected columns.

24. The flash memory device according to claim 19, wherein addresses from the address generator are received from the external according to an external address command.

25. The flash memory device according to claim 19, wherein addresses from the address generator are generated internally by the control logic.

26. A voltage level detecting circuit in a memory device, the voltage level detecting circuit comprising:

a first voltage threshold detector having an input terminal for accepting a power supply voltage and having an output terminal, the first threshold detector structured to generate a first signal on its output terminal when the power supply voltage reaches a first voltage level;

a second voltage threshold detector having an input terminal for accepting the power supply voltage and having an output terminal, the second threshold detector structured to generate a second signal on its output terminal when the power supply voltage reaches a second voltage level, the second voltage level being higher than the first voltage level;

a latch circuit coupled to the output of the first voltage threshold detector and coupled to the output of the second voltage threshold detector, the latch circuit structured to generate a power on signal at a latch output after receiving the first signal and the second signal.

27. The voltage level detecting circuit of claim 26 wherein the latch circuit comprises:

a first input terminal structured to receive a first input signal from one of the voltage threshold detectors;

a second input terminal structured to receive a second input signal from the other of the voltage threshold detectors;

an inverter coupled to the first input terminal and having an inverter output;

a first logic component having a first input coupled to the inverter output, and having a second input coupled to an output of a second logic component; and the second logic component having a first input coupled to the second input terminal, and having a second input coupled to an output of the first logic component.

28. The voltage level detecting circuit of claim 26, wherein the latch circuit comprises:

a first input terminal structured to receive the first signal;

a second input terminal structured to receive the second signal;

an inverter coupled to the second input terminal and having an inverter output;

a first NOR gate having a first input coupled to the first input terminal output, and having a second input coupled to an output of a second NOR gate; and the second NOR gate having a first input coupled to the inverter output, and having a second input coupled to an output of the first NOR gate.

29. The voltage level detecting circuit of claim 26, wherein the latch circuit comprises:

a first input terminal structured to receive the first signal;

a second input terminal structured to receive the second signal;

an inverter coupled to the second input terminal and having an inverter output;

a first NAND gate having a first input coupled to the first inverter output, and having a second input coupled to an output of a second NAND gate; and the second NAND gate having a first input coupled to the second input terminal, and having a second input coupled to an output of the first NAND gate.

30. The voltage level detecting circuit of claim 26, wherein the first voltage threshold detector circuit comprises:

a voltage level detector structured to generate an indication signal when the power supply voltage reaches the first threshold level; and a signal buffer coupled to the voltage level detector and structured to generate the first signal after the signal buffer receives the indication signal.

31. The voltage level detecting circuit of claim 30 wherein the voltage level detector of the first voltage threshold detector circuit comprises:

a plurality of PMOS transistors connected in series between the power supply voltage and a first node, the gates of the PMOS transistors coupled to a ground reference voltage;

a plurality of NMOS transistors which are connected in series between the first node and the ground reference voltage, the gates of the depletion-type NMOS transistors coupled to the ground reference voltage; and a capacitor connected between the first node and the ground reference voltage.

32. The voltage level detecting circuit of claim 30 wherein the signal buffer comprises one or more serially coupled inverters.

33. The voltage level detecting circuit of claim 26, wherein the second voltage threshold detector circuit comprises:

a voltage level detector structured to generate an indication signal when the power supply voltage reaches the second threshold level; and a signal buffer coupled to the voltage level detector and structured to generate the second signal after the signal buffer receives the indication signal.

34. The voltage level detecting circuit of claim 33 wherein the voltage level detector of the second voltage threshold detector circuit comprises:

a plurality of PMOS transistors connected in series between the power supply voltage and a first node, the gates of the PMOS transistors coupled to a ground reference voltage;

a plurality of NMOS transistors which are connected in series between the first node and the ground reference voltage, the gates of the depletion-type NMOS transistors coupled to the ground reference voltage; and a capacitor connected between the first node and the ground reference voltage.

35. The voltage level detecting circuit of claim 34 wherein the signal buffer coupled to the voltage level detector of the second voltage threshold detector circuit comprises a synchronization circuit and an inverter coupled to the synchronization circuit.

36. A method of generating a power-on reset signal, by which logic circuits in a flash memory device are reset, and a power-on read signal, by which a read operation of the memory device is triggered, comprising:

generating the power-on reset signal following a power supply voltage when the power supply voltage is lower than a first voltage at power-on;

generating a detection signal; and generating the power-on read signal in response to the power-on reset signal and the detection signal, wherein the detection signal indicates the same logic state as the power-on reset signal when the power supply voltage is lower than the first voltage, and follows the power supply voltage when the power supply voltage is lower than a second voltage, the second voltage being higher than the first voltage; and wherein the power-on read signal has a logically inactivated state when the power supply voltage is lower than the first voltage and a logically activated state when the power supply voltage is over the second voltage.

37. A method of reading a memory device at power-on, comprising:

generating a power-on reset signal following a power supply voltage when the power supply voltage is lower than a first voltage at power-on;

generating a detection signal;

generating a power-on read signal in response to the power-on reset signal and the detection signal; and reading out data from a memory cell array in response to an address generated by an external address command, wherein the power-on read signal has a logically activated state when the power supply voltage is higher than a second voltage, the second voltage being higher than the first voltage;

wherein the detection signal indicates the same logic state as the power-on reset signal when the power supply voltage is lower than the first voltage, and follows the power supply voltage when the power supply voltage is lower than the second voltage; and wherein the power-on read signal is logically re-activated only when the power supply voltage is lowered below the first voltage and then raises above the second voltage.

38. A method of generating a power on reset signal, comprising:

sensing when a power supply voltage has reached a first voltage level and generating a first signal when the first voltage level has been reached;

sensing when the power supply voltage has reached a second voltage level and generating a second signal when the second voltage level has been reached, the second voltage level higher than the first voltage level; and generating a power level signal only after the first signal and the second signal have been generated.

39. The method of claim 38, further comprising maintaining the power on reset signal even if the power supply voltage falls below the second voltage level.

40. The method of claim 39 wherein generating the power level signal comprises setting the power level signal in a latch after the latch receives the first signal and the second signal.

* * * * *